United States Patent [19]

Matsumura et al.

[11] Patent Number: 5,181,984
[45] Date of Patent: Jan. 26, 1993

[54] PRODUCTION OF SOLDER MASKED ELECTRIC CIRCUIT BOARDS

[75] Inventors: Akira Matsumura, Hirakata; Katsukiyo Ishikawa, Kyoto, both of Japan

[73] Assignee: Nippon Paint Co., Ltd., Osaka, Japan

[21] Appl. No.: 773,119

[22] Filed: Oct. 8, 1991

[30] Foreign Application Priority Data

Oct. 8, 1990 [JP] Japan ................... 2-270959

[51] Int. Cl.⁵ .................. B44C 1/22; B29C 37/00
[52] U.S. Cl. ........................ 156/630; 156/633; 156/655; 156/659.1; 156/660; 156/901; 156/904; 205/188
[58] Field of Search ............ 156/630, 631, 633, 655, 156/659.1, 660, 668, 901, 902, 904; 427/43.1, 96, 97; 430/313, 315; 204/14.1, 32.1, 35.1, 38.7; 29/846, 852

[56] References Cited

U.S. PATENT DOCUMENTS

| | | | |
|---|---|---|---|
| 4,746,399 | 5/1988 | Demmer et al. | 156/656 |
| 4,861,438 | 8/1989 | Banks et al. | 204/15 |
| 4,983,252 | 1/1991 | Masui et al. | 156/630 |
| 5,102,519 | 4/1992 | Matuyama et al. | 204/180.6 |

*Primary Examiner*—William A. Powell
*Attorney, Agent, or Firm*—Wenderoth, Lind & Ponack

[57] ABSTRACT

The present invention provides a process for forming a solder mask on an electric circuit board without any defects. The process comprises forming an electric circuit on a substrate, coating a negative type photosensitive solder resist on the obtained electric circuit board, and then exposing to light through a negative film followed by developing, characterized in that the negative type photosensitive solder resist is electrodepositable and said coating of the solder resist is conducted by electrocoating the resist on an electroconductive transfer substrate which is different from the electric circuit board and then transferring the coated film onto the electric circuit board.

3 Claims, 1 Drawing Sheet

PRODUCTION OF SOLDER MASKED ELECTRIC CIRCUIT BOARDS

FIELD OF THE INVENTION

The present invention relates to a process for producing an electric circuit board which is solder-masked.

BACKGROUND OF THE INVENTION

A printed circuit board is a board on which a copper thin film is patterned as an electric circuit. In order to electrically connect with electric elements, a soldering process wherein the circuit is soldered with the electric elements is necessary. It, however, is very difficult to solder on the fine and complicated electric circuit. Accordingly, it is proposed that the portions not to be soldered are covered with a solder mask which is a protective layer having high heat resistance, and that the portions to be soldered are not covered with the solder mask. The solder masked electric circuit board is directly dipped in a solder bath to connect with the electric elements.

The solder mask is generally formed by coating a negative type photosensitive solder resist on the surface of the circuit board followed by exposing to light though a negative film and developing. The coating process of the negative type photosensitive solder resist is classified into three type, i.e. a printing process, a dry film process and a liquid resist process. In the printing process and the liquid resist process, it is essential to employ a liquid resist, thus the edge (corner) portion of the copper film being not covered with the resist. Also, there may be through-holes present in the electric circuit board, but the liquid resist may flow into the through-holes. In the dry film process wherein a dried film of the photosensitive resist is covered on the electric circuit board, some air spaces are formed between the dried film and the board due to the thickness of the copper film. It may happen that solder invades into the air spaces or that the air in the air space expands to cause blisters. Accordingly, masking effects are not ensured sufficiently also in the dry film process.

SUMMARY OF THE INVENTION

The present invention provides a process for forming a solder mask on an electric circuit board without the above mentioned defects. The process comprises forming an electric circuit on a substrate, coating a negative type photosensitive solder resist on the obtained electric circuit board, and then exposing to light through a negative film followed by developing, characterized in that the negative type photosensitive solder resist is electrodepositable and said coating of the solder resist is conducted by electrocoating the resist on an electroconductive transfer substrate which is different from the electric circuit board and then transferring the coated film onto the electric circuit board.

DETAILED DESCRIPTION OF THE INVENTION

With referring to FIG. 1, the process of the present invention is illustrated. As shown in FIG. 1(a), an electroconductive transfer substrate 1 is prepared by forming an electroconductive surface made from, for example, copper or electroconductive metal thereon. Then, a negative type electrodepositable photosensitive solder resist composition is electrocoated on the electroconductive substrate 1.

The electrodepositable photosensitive solder resist composition generally comprises (i) a negative type photosensitive resin as a film-forming component, (ii) an organic solvent which controls electrodeposition ability and mixture stability and provides good producibility, (iii) an alkaline or acidic material which dissolves the photosensitive resin (i), (iv) a polymerization initiator, and (v) if necessary an additives, a photosensitizer or a dye for providing surface smoothness, electrodeposition ability and mixture stability.

The cationic or anionic negative type photosensitive resin composition is described in Japanese Kokai Publications 61-247090 and 62-262856 which corresponds to U.S. Pat. No. 4,671,854 and U.S. Pat. No. 4,845,012 which are incorporated herein. In order to use as a solder resist, the composition needs heat resistance which, however, is imparted by adding a pigment and the like. Typical examples of the pigments are calcium carbonate, magnesium sulfate, talc, kaolin, aluminum sulfate, calcium silicate, magnesium silicate, aluminum silicate and the like.

The organic solvent (ii) includes an ethyleneglycol monoalkyl ether, such as ethyleneglycol monoethyl ether and ethyleneglycol monobutyl ether; an alcohol, such as isopropanol and butanol; a glycol; a carbitol; and the like. The organic solvent (ii) may be a hydrophobic solvent, such as xylol, toluol, mineral turpentine and the like.

The polymerization initiator (iv) of the present invention includes benzoins, such as benzoin, benzoin methyl ether, benzoin ethyl ether, benzoin isopropyl ether and benzoin isobutyl ether; benzophenones, such as 2-chlorobenzophenone, 4-methoxybenzophenone, 4,4'-dimethylbenzophenone, 2-chloro-4-methylbenzophenone, 3-ethylbenzophenone and 4-t-butylbenzophenone; diacetyl benzilate; acetophenone; anthraquinones, such as 2-ethylacetoanthraquinone, 2-ethylanthraquinone, 2-t-butylanthraquinone and 2-chloroanthraquinone; diphenyldisteroid; alpha-fluoromethylnaphthalene; andthracene; and the like.

As the optional component (v), the additives include a dispersant, a leveling agent, a defoaming agent and the like. The dye includes phthalocyanine green, phthalocyanine blue, an azo dye and the like.

Figure 1A:
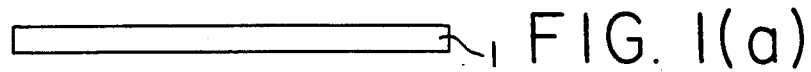
FIGS. 1(a)-1(f) are process drawings which show the process of the present invention.
Figure 1B:
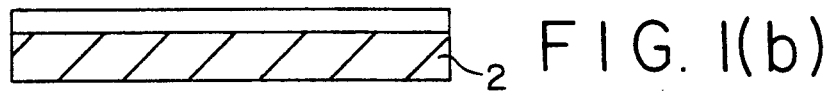
Figure 1C:
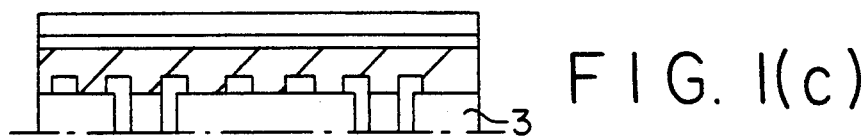
Figure 1D:
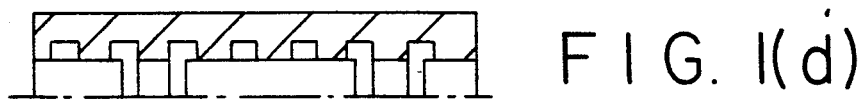
Figure 1E:
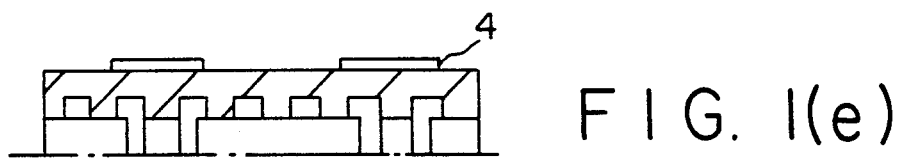
Figure 1F:
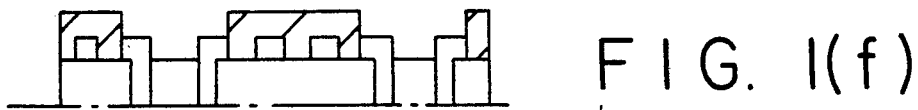

The electrocoated film 2 is faced with an electric circuit board 3 and then contacted as shown in FIG. 1(c). The electrocoated film is easily removable from the electroconductive transfer substrate 1 and transferred onto the electric circuit board 3 as shown in FIG. 1 (d). The transferring may be conducted by pressing the electroconductive transfer substrate 1 with a rubber-covered roller to promote adhesiveness between the electrocoated film and the circuit board. If necessary, heat is also applicable to enhance the adhesiveness.

Next, a negative film 4 is contacted with the photosensitive solder resist 2, as shown in FIG. 1 (e) and then exposed to light, whereby the exposed portion cures. After developing, the unexposed portion is eluted off with a developer and the electric circuit therebeneath comes to appear to obtain a solder-masked electric circuit. The exposing technique and conditions are known to the art and not explained in detail herein.

EXAMPLES

The present invention is illustrated by the following Examples which, however, are not construed as limiting the present invention to their details.

PREPARATION EXAMPLE 1

Preparation of an Anionic Negative Type Photosensitive Resin Composition

A mixture of 40 parts by weight of methyl methacrylate, 40 parts by weight of butyl acrylate, 20 parts by weight of acrylic acid and 2 parts by weight of azobisisobutylonitrile was added dropwise over 3 hours to 90 parts by weight of ethyleneglycol monobutyl ether at 90° C. in a nitrogen gas atmosphere. After adding, it was aged for 30 minutes, to which a mixture of 1 part by weight of azobisisobutylonitrile and 10 parts by weight of ethyleneglycol monobutyl ether was added dropwise for 30 minutes. It was then aged for 5 hours to obtain an acryl resin solution having an acid value of 155.

To the content, 24 parts by weight of glycidyl methacrylate, 0.12 parts by weight of hydroquinone and 0.6 parts by weight of tetraethylammonium bromide were added, and reacted for 5 hours with air blowing at 90° C. to obtain a photosensitive resin composition having an acid value of about 50.

PREPARATION EXAMPLE 2

Preparation of a Cationic Negative Type Photosensitive Resin Composition

A mixture of 30 parts by weight of N,N-diethylaminoethyl methacrylate, 20 parts by weight of styrene, 50 parts by weight of ethyl acrylate and 2 parts by weight of azobisisobutylonitrile was added dropwise over 3 hours to 90 parts by weight of ethyleneglycol monobutyl ether at 90° C. in a nitrogen gas atmosphere. After adding, it was aged for 30 minutes, to which a mixture of 1 part by weight of azobisisobutylonitrile and 10 parts by weight of ethyleneglycol monobutyl ether was added dropwise for 30 minutes. It was then aged for 3 hours to obtain a cationic negative type photosensitive resin composition.

EXAMPLE 1

An electrocoating composition was prepared from the following ingredients.

| Ingredients | Parts by weight |
| --- | --- |
| Epoxy acrylate | 50 |
| Anionic negative type photosensitive resin composition of Preparation Example 1 | 50 |
| Trimethylolpropane triacrylate | 10 |
| Benzoin isobutyl ether (polymerization initiator) | 5 |
| Talc | 20 |
| Barium sulfate | 20 |
| Phthalocyanine green | 2 |

The above ingredients were mixed with a three-roll mil, to which triethylamine of 0.6 equivalent was added and deionized water was added to adjust a nonvolatile content of 10% to obtain an electrocoating composition.

An electroconductive transfer substrate 1 was prepared by forming a copper layer on a polyimide film. The copper layer was connected with a positive electrode and an electrodeposition bath was connected with a negative electrode, and the substrate 1 was immersed in the electrodeposition bath. A direct current of 100 volt was applied for two minute to deposit the electrodepositable resin composition onto the transfer substrate 1, and rinsed with water and dried to form a photosensitive resin layer 2 on the transfer substrate 1.

The photosensitive resin layer 2 was faced and contacted with a circuit board 3 which had had a patterned circuit. It was pressed by a heated rubber roller to transfer the photosensitive resin layer 2 onto the circuit board 3. A negative film 4 was piled on the photosensitive resin layer 2 and closely contacted under a reduced pressure of 100 mm Hg. The resin plate was exposed to a high pressure mercury lamp at 400 mJ/cm$^2$ through the negative film 4 to cure. It was then developed with a 0.5% sodium carbonate solution to remove the uncured portion. The circuit board was then rinsed with water and post-cured to a ultraviolet light at 1 J/cm$^2$ to stably cure the photoresist, thus obtaining a solder masked circuit board.

The solder masked circuit board had no resin on the developed circuit portion and the photoresist had smooth surface. The cured photoresist had good physical properties, showing a hardness of 4 H and a crosscut test of 100/100.

The solder masked circuit board was dipped in a water soluble flux, and then dipped in a solder bath having 260° C. for 30. After soldering, the photoresist had no solder remaining and showed good heat resistance.

EXAMPLE 2

An electrocoating composition was prepared from the following ingredients.

| Ingredients | Parts by weight |
| --- | --- |
| Epoxy acrylate | 30 |
| Cationic negative type photosensitive resin composition of Preparation Example 2 | 40 |
| 2-hydroxyethyl acrylate | 10 |
| Dipentaerythritol hexaacrylate | 20 |
| Benzoin ethyl ether (polymerization initiator) | 5 |
| Talc | 20 |
| Kaolin | 20 |
| Phthalocyanine green | 2 |

The above ingredients were mixed with a three-roll mil, to which acetic acid of 0.5 equivalent was added and deionized water was added to adjust a nonvolatile content of 10% to obtain an electrocoating composition.

An electroconductive transfer substrate 1 was prepared by forming a copper layer on a polyimide film. The copper layer was connected with a positive electrode and an electrodeposition bath was connected with a negative electrode, and the substrate 1 was immersed in the electrodeposition bath. A direct current of 100 volt was applied for two minute to deposit the electrodepositable resin composition onto the transfer substrate 1, and rinsed with water and dried to form a photosensitive resin layer 2 on the transfer substrate 1.

The photosensitive resin layer 2 was faced and contacted with a circuit board 3 which had had a patterned circuit. It was pressed by a heated rubber roller to transfer the photosensitive resin layer 2 onto the circuit board 3. A negative film 4 was piled on the photosensitive resin layer 2 and closely contacted under a reduced pressure of 90 mm Hg. The resin plate was exposed to a high pressure mercury lamp at 350 mJ/cm$^2$ through the negative film 4 to cure. It was then developed with a 0.5% acetic acid solution to remove the uncured portion. The circuit board was then rinsed with water and post-cured to a ultraviolet light at 1.2 J/cm$^2$ to stably cure the photoresist, thus obtaining a solder masked circuit board.

The solder masked circuit board had no resin on the developed circuit portion and the photoresist had smooth surface. The cured photoresist had good physical properties, showing a hardness of 4 H and a cross-cut test of 100/100.

The process of the present invention is very easily applicable to any type of printed circuit boards, because the photosensitive resin composition is electrodeposited on a transfer substrate and transferred onto the circuit boards due to the removable properties of the electrocoated film. The electrocoated film is very flexible and shaped to the copper circuit on the board. Since the electrocoated film is not liquid, it can not flowed into through-holes.

What is claimed is:

1. A process for producing an electric circuit board which is masked with a solder resist excepting a portion to be soldered, comprising forming an electric circuit on a substrate, coating a negative type photosensitive solder resist on the obtained electric circuit board, and then exposing to light through a negative film followed by developing, characterized in that said negative type photosensitive solder resist is electrodepositable and said coating of the solder resist is conducted by electrocoating the resist on an electroconductive transfer substrate which is different from the electric circuit board and then transferring the coated film onto the electric circuit board.

2. The process according to claim 1 wherein said electrodepositable photosensitive solder resist composition comprises (i) a negative type photosensitive resin as a film-forming component, (ii) an organic solvent, (iii) an alkaline or acidic material which dissolves the photosensitive resin (i) and (iv) a polymerization initiator.

3. The process according to claim 1 wherein said transferring is conducted by pressing the electroconductive transfer substrate with a heated rubber-covered roller.

* * * * *